United States Patent
Annunziata et al.

(10) Patent No.: US 10,497,862 B2
(45) Date of Patent: Dec. 3, 2019

(54) ENHANCED COERCIVITY IN MTJ DEVICES BY CONTACT DEPTH CONTROL

(71) Applicant: INTERNATIONAL BUSINESS MACHINES CORPORATION, Armonk, NY (US)

(72) Inventors: Anthony J. Annunziata, Stamford, CT (US); Gen P. Lauer, Yorktown Heights, NY (US); Nathan P. Marchack, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/023,090

(22) Filed: Jun. 29, 2018

(65) Prior Publication Data

US 2018/0309053 A1 Oct. 25, 2018

Related U.S. Application Data

(63) Continuation of application No. 15/487,906, filed on Apr. 14, 2017, now Pat. No. 10,084,127, which is a continuation of application No. 14/971,058, filed on Dec. 16, 2015, now Pat. No. 9,660,179.

(51) Int. Cl.
| | | |
|---|---|---|
| H01L 27/00 | (2006.01) | |
| H01L 43/12 | (2006.01) | |
| H01L 43/08 | (2006.01) | |
| H01L 43/02 | (2006.01) | |

(Continued)

(52) U.S. Cl.
CPC ............ *H01L 43/12* (2013.01); *G11C 11/161* (2013.01); *H01L 27/224* (2013.01); *H01L 43/02* (2013.01); *H01L 43/08* (2013.01); *H01L 27/222* (2013.01)

(58) Field of Classification Search
CPC ..... H01L 27/222; H01L 27/224; H01L 43/08; H01L 43/02; H01L 43/12
See application file for complete search history.

(56) References Cited

U.S. PATENT DOCUMENTS

| | | |
|---|---|---|
| 3,516,881 A | 6/1970 | Powell et al. |
| 8,335,105 B2 | 12/2012 | Wang et al. |
| 8,372,661 B2 | 2/2013 | Horng et al. |

(Continued)

OTHER PUBLICATIONS

List of IBM Patents or Patent Applications Treated as Related dated Jun. 29, 2018, 2 pages.

*Primary Examiner* — Mounir S Amer
*Assistant Examiner* — Alexander Belousov
(74) *Attorney, Agent, or Firm* — Tutunjian & Bitetto, P.C.; Erik Johnson

(57) ABSTRACT

A magnetic memory device includes a magnetic memory stack including a bottom electrode and having a hard mask formed thereon. An encapsulation layer is formed over sides of the magnetic memory stack and has a thickness adjacent to the sides formed on the bottom electrode. A dielectric material is formed over the encapsulation layer and is removed from over the hard mask and gapped apart from the encapsulation layer on the sides of the magnetic memory stack to form trenches between the dielectric material and the encapsulation layer at the sides of the magnetic memory stack. A top electrode is formed over the hard mask and in the trenches such that the top electrode is spaced apart from the bottom electrode by at least the thickness.

20 Claims, 6 Drawing Sheets

(51) Int. Cl.
*H01L 27/22* (2006.01)
*G11C 11/16* (2006.01)

(56) References Cited

U.S. PATENT DOCUMENTS

| | | |
|---|---|---|
| 8,749,003 B2 | 6/2014 | Horng et al. |
| 8,920,947 B2 | 12/2014 | Zhang et al. |
| 8,946,834 B2 | 2/2015 | Wang et al. |
| 9,054,300 B2 | 6/2015 | Annunziata et al. |
| 9,070,868 B2 | 6/2015 | Annunziata et al. |
| 2003/0219984 A1* | 11/2003 | Ying .................. B82Y 25/00 438/709 |
| 2012/0299398 A1 | 11/2012 | Morimoto |
| 2015/0041935 A1 | 2/2015 | Wang et al. |
| 2015/0056368 A1 | 2/2015 | Wang et al. |

\* cited by examiner

ENHANCED COERCIVITY IN MTJ DEVICES BY CONTACT DEPTH CONTROL

BACKGROUND

Technical Field

The present invention relates to magnetic memory devices, and more particularly to magnetic memory devices having enhanced coercivity.

Description of the Related Art

Spin-transfer torque magnetoresistive random access memory (STT-MRAM) devices have emerged as a potential future memory candidate to supplant dynamic random-access memory (DRAM) and static random-access memory (SRAM). MRAM offers the ability to significantly reduce the power consumption in an "idle" state as data is stored via magnetic spin state/magnetization of the device, e.g., this type of memory does not require a constant current supply to retain its storage. However, an important parameter for determining the viability of these devices is coercivity (Hc), which is defined as the intensity of an applied magnetic field needed to switch a state of magnetization.

Increased Hc is an important characteristic for potential MRAM technologies as it defines an external magnetic field needed to change a memory state of a device. Low Hc values are thus problematic as they indicate an increased probability that the data stored could be inadvertently altered or erased by exposure to external magnetic fields.

SUMMARY

A magnetic memory device includes a magnetic memory stack including a bottom electrode and having a hard mask formed thereon. An encapsulation layer is formed over sides of the magnetic memory stack and has a thickness adjacent to the sides formed on the bottom electrode. A dielectric material is formed over the encapsulation layer and is removed from over the hard mask and gapped apart from the encapsulation layer on the sides of the magnetic memory stack to form trenches between the dielectric material and the encapsulation layer at the sides of the magnetic memory stack. A top electrode is formed over the hard mask and in the trenches such that the top electrode is spaced apart from the bottom electrode by at least the thickness.

A method for fabricating a magnetic memory device includes forming a magnetic memory stack with a hard mask thereon on top of a bottom electrode; depositing an encapsulation layer over a top and sides of the hard mask and the magnetic memory stack, the encapsulation layer having a thickness adjacent to the sides of magnetic memory stack formed on the bottom electrode; forming a dielectric material over the encapsulation layer; etching a recess in the dielectric material and the encapsulation layer to expose the hard mask; etching the dielectric material to form trenches between the dielectric material and the encapsulation layer at the sides of the magnetic memory stack; and forming a top electrode over the hard mask and in the trenches such that the top electrode is spaced apart from the bottom electrode by at least the thickness.

Another method for fabricating a magnetic memory device includes forming a magnetic memory stack with a hard mask thereon on top of a bottom electrode; depositing an encapsulation layer over a top and sides of the hard mask and the magnetic memory stack, the encapsulation layer being formed on portions of the bottom electrode; forming an etch stop layer on the encapsulation layer; forming a dielectric material over the etch stop layer; etching a recess in the dielectric material to expose the etch stop layer; etching the etch stop layer and the encapsulation layer selective to the dielectric material to expose the hard mask; etching the dielectric material to form trenches between the dielectric material and the etch stop layer at the sides of the magnetic memory stack; and forming a top electrode over the hard mask and in the trenches such that the top electrode is spaced apart from the bottom electrode by a dielectric thickness.

Yet another method for fabricating a magnetic memory device includes forming an encapsulation layer having a thickness adjacent to sides of a magnetic memory stack formed on a bottom electrode; etching a recess through the encapsulation layer to expose a hard mask formed on the memory stack; forming trenches between a dielectric material and the encapsulation layer at the sides of the magnetic memory stack; and forming a top electrode over the hard mask and in the trenches such that the top electrode is spaced apart from the bottom electrode by at least the thickness.

Still another method for fabricating a magnetic memory device includes controlling a thickness of an encapsulation layer formed over a magnetic memory stack to control coercively (Hc) of a magnetic memory stack, the thickness being adjacent to sides of the magnetic memory stack, which is formed on a bottom electrode; etching a recess through the encapsulation layer to expose a hard mask formed on the memory stack; forming trenches between a dielectric material and the encapsulation layer at the sides of the magnetic memory stack; and forming a top electrode over the hard mask and in the trenches such that the top electrode is spaced apart from the bottom electrode by at least the thickness.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
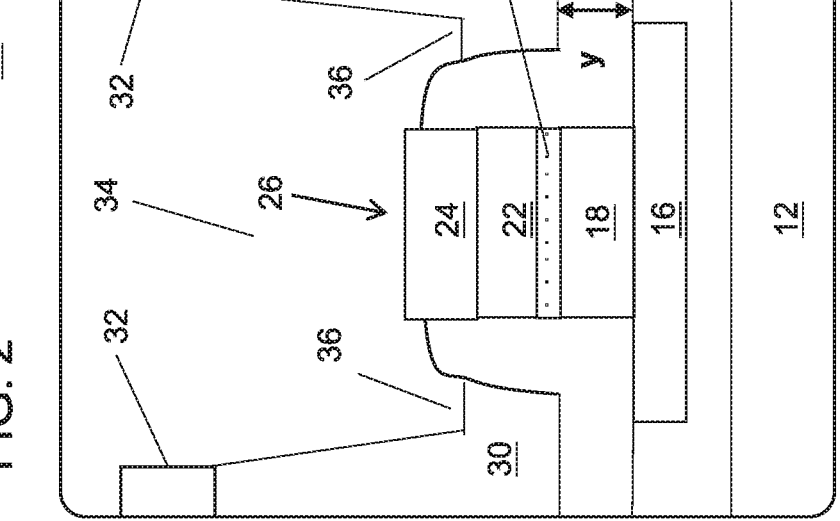
FIG. 1 is a cross-sectional view of a magnetic memory device (e.g., a spin-transfer torque magnetoresistive random access memory (STT-MRAM)) having an encapsulation layer formed thereon in accordance with the present principles.

In accordance with the present principles, systems, devices and methods for enhanced coercivity are provided by controlling a depth of contact to a magnetic tunnel junction (MTJ) device, using selective chemistry to control the depth of the contact. In one embodiment, Hc is improved by establishing a deep trench contact to the MTJ device. The etch process includes forming an initial contact to tops of the devices, which is made using a non-selective chemistry, and then a trench is subsequently deepened using a selective chemistry that removes an interlayer dielectric (e.g., an oxide material) preferentially to an MTJ encapsulation layer (e.g., a nitride). The contact depth is controlled by the thickness of the encapsulation layer surrounding the MTJ device.

A method for increasing Hc of perpendicularly magnetized spin torque transfer magnetoresistive random access memory (STT-MRAM) includes controlling the depth of contact to the device through selection of the dielectric encapsulation and process chemistry. For small device diameters (e.g., less than 50 nm) in many applications, varying the depth of contact by ~20-30 nm results in a marked (>200%) increase in Hc. In useful embodiments, the depth of a trench contact is controlled by the thickness of the encapsulation surrounding the device. The use of an etch process permits depth control. In one step, a non-selective chemistry is employed to remove an insulating/interlayer dielectric (ILD) material, and contact a top hard mask of the device. A next step employs a selective chemistry to remove the remaining ILD material and stops on a bottom encapsulation layer, to pattern a deep trench contact.

In another embodiment, an etch stop layer is employed to further enhance a process window. It should be understood that additional etch steps may be employed to open the etch stop layer. A controllable contact process with increased process window, increases thermal contact to active MTJ devices due to a larger surface area of contact after trench etch, and increases Hc values due to deep trench processing by enhanced stress or other mechanisms.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., Ni—Fe, etc. These compounds include different proportions of the elements within the compound. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B)

only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated MTJ or MRAM pillar device 10 is illustratively shown in accordance with the present principles. The device 10 includes a trench height controlled by an encapsulation layer thickness. The device 10 includes a substrate 12 having a dielectric layer 14 formed thereon. The substrate may include any suitable materials includes Si, Ge, glass, sapphire, III-V materials, ceramic, etc. The dielectric layer 14 may include an oxide, e.g., silicon dioxide, although other dielectric materials may be employed. A bottom electrode 16 is formed on or in the dielectric layer 14. The bottom electrode 16 is patterned by forming trenches in the dielectric layer 14, depositing the bottom electrode materials and planarizing the dielectric layer 14 and the material for the bottom electrode 16 to form the bottom electrode 16 within the trench (in the dielectric layer 14). The planarizing may include a chemical mechanical polish (CMP) process. In other embodiments, the material for the bottom electrode 16 may be formed on the dielectric layer 14 and patterned. Then, a dielectric layer may be formed and polished (CMP) to provide the same structure. Other processes may also be employed.

The bottom electrode 16 may include a conductive material, such as Cu, Al, Ag, Au, Pt, W, etc. The bottom electrode 16 is connected to other metallization connections (not shown) to enable a current to be applied for reading and writing to the device 10.

An MRAM stack is formed by depositing a reference layer 18, a barrier layer 20, a free layer 22 and a hard mask 24. The hard mask 24 may include TaN, but other metal nitrides, such as, e.g., TiN and other metals, such as, e.g., Ta or W may also be employed. The MRAM stack is patterned using a lithography and etch process to form pillars 26. The reference layer 18 includes a ferromagnetic material that is magnetized (spin) in one direction. This provides a reference magnetic field for programming the free layer 22. The free layer 22 includes a ferromagnetic material that may be magnetized in a same direction or in an opposite direction of the reference layer 18 to designate binary information or states. The reference layer 18 and the free layer 22 are separated by the barrier layer 20. The ferromagnetic materials may include Fe, Ni, Co, Mn or alloys thereof. The barrier layer 20 may include an oxide, such as, e.g., $Al_2O_3$, $TiO_2$, etc.

Electrical resistance of the stack 26 depends on the relative orientation of portions of the free (storage) layer 22 and reference layer 18 that interface with the non-magnetic tunnel barrier 20. The free layer 22 is free to toggle back and forth by an applied field. If the magnetic orientation of the free layer 22 is parallel to the magnetic orientation of the reference layer 18, then the MTJ stack 26 will have low resistance; if the reference layer 18 is anti-parallel to the free layer 22, the stack 26 will have high resistance.

The MRAM pillar device 10 is encapsulated in an encapsulation layer or film 28. The encapsulation layer 28 includes a dielectric layer. In one embodiment, the encapsulation layer 28 includes a nitride film, e.g., SiN. The layer 28 may be deposited by, e.g., physical vapor deposition (PVD), plasma-enhanced chemical vapor deposition (PECVD) or any other suitable process. A height (y) or thickness of the layer 28 above the bottom contact electrode 16 can be controlled by varying deposition time. In one embodiment, y is between about 10 nm and 40 nm. The thickness, y, provides a minimum dielectric separation over the bottom electrode 16.

The device 10 is then covered with a dielectric material 30. In one embodiment, the encapsulation layer 28 may include a nitride, and the dielectric material 30 may include an oxide, e.g. $SiO_x$. A photoresist 32 is deposited on (e.g., spun on) the dielectric material 30 and patterned using lithography. The photoresist 32 is opened up over the device 10.

Figure 2:
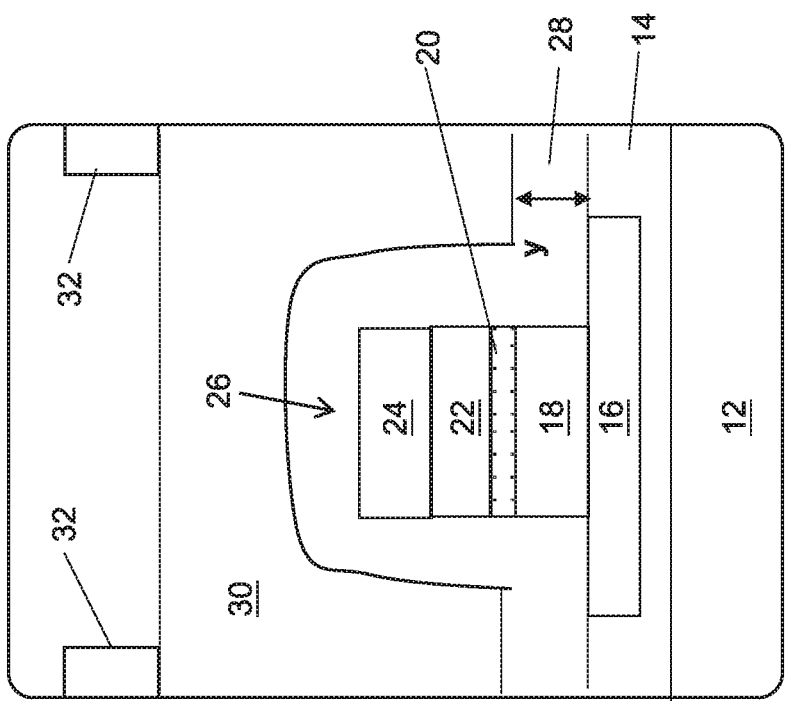
FIG. 2 is a cross-sectional view of the magnetic memory device of FIG. 1 having a recess formed over the device and a hard mask being exposed in accordance with the present principles.

Referring to FIG. 2, the dielectric material 30 is etched using a non-selective chemistry that will remove the dielectric material 30 and etch a top portion of the encapsulation layer 28 to expose the hard mask 24. The hard mask 24 may include $SiN_x$ and should have a higher etch resistance than the encapsulation layer 28.

The etch process may include a reactive ion etch (RIE) process with a fluorine-based chemistry or equivalent for opening the dielectric material and exposing the hard mask 24. In one embodiment, the RIE removes SiOx and SiNx (for dielectric materials 30 and encapsulation layer 28). By use of a timed or end pointed etch, the encapsulation layer 28 is opened to expose the hard mask 24. A level of the dielectric material 30 remains in regions 36 on sides of the pillar 26 over horizontal portions of the encapsulation layer 28. A recess 34 is etched into and aligned to the pillar 26 using the resist 32 as a mask.

Figure 3:
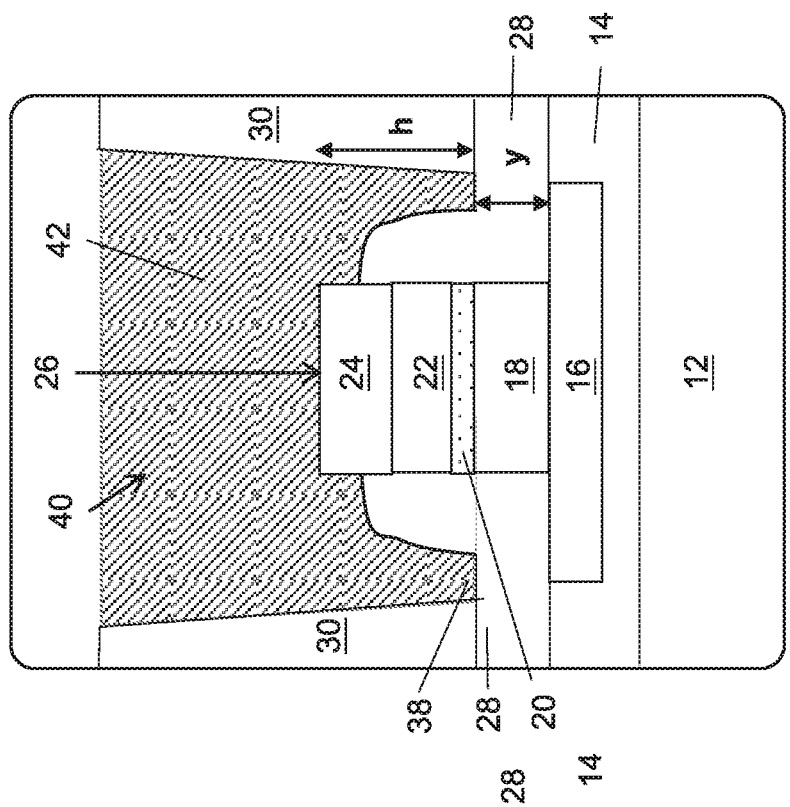
FIG. 3 is a cross-sectional view of the magnetic memory device of FIG. 2 having lateral trenches formed on sides of a magnetic stack in accordance with the present principles.

Referring to FIG. 3, another etch process employs a selective chemistry to etch the dielectric material 30 preferentially to the encapsulation layer 28 and the hard mask 24, e.g., etch oxide preferentially to nitride. This permits a trench contact depth (h) from a top of the hard mask 24 to the encapsulation layer 28 to be controlled by the height (y) of the encapsulation layer 28 over the bottom contact electrode 16. The dielectric material 30 is etched to form trenches 38 on top of the encapsulation layer 28 and on lateral sides of the pillar 26.

Figure 4:
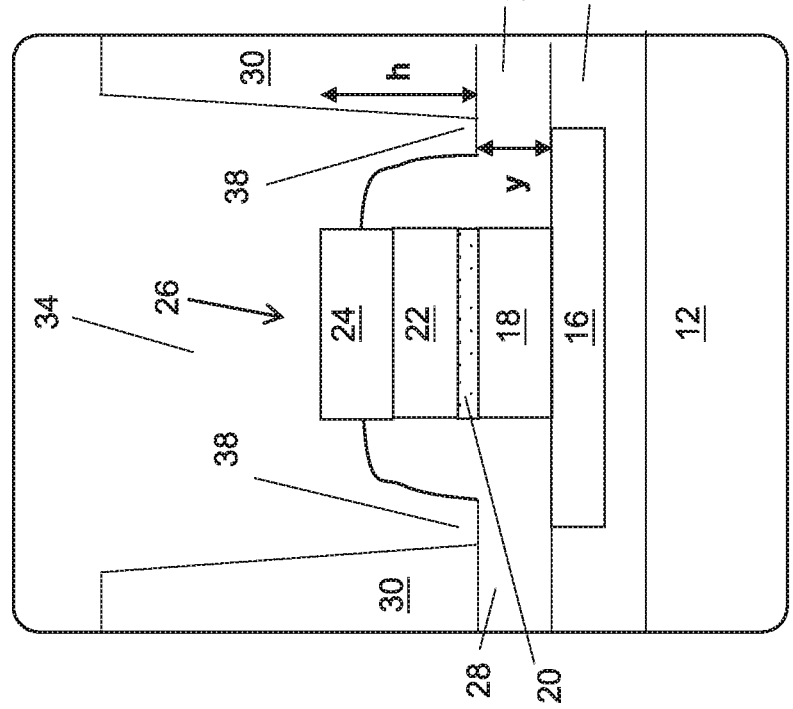
FIG. 4 is a cross-sectional view of the magnetic memory device of FIG. 3 showing a top electrode formed in the lateral trenches on the sides of the magnetic stack in accordance with the present principles.

Referring to FIG. 4, a conductive material 40 is deposited over the dielectric material 30 and planarized to form a top electrode 42. The top electrode 42 fills the trenches 38 on sides of the stack 26. The conductive material 40 remains gapped by at least the distance y on the encapsulation layer 28. The encapsulation layer 28 ensures that coercively remains high in changing the state of the device 10, and in particular, by ensuring that a minimum amount or dielectric (distance y) exists between the top electrode 42 and the bottom electrode 16 to prevent the top electrode 42 from being shorted to the bottom electrode 16. The top electrode 42 may include a conductive material, such as Cu, Al, Ag, Au, Pt, W, etc. The top electrode 42 is connected to other metallization connections (not shown) to enable a current to be applied for reading and writing to the device 10.

Figure 5:
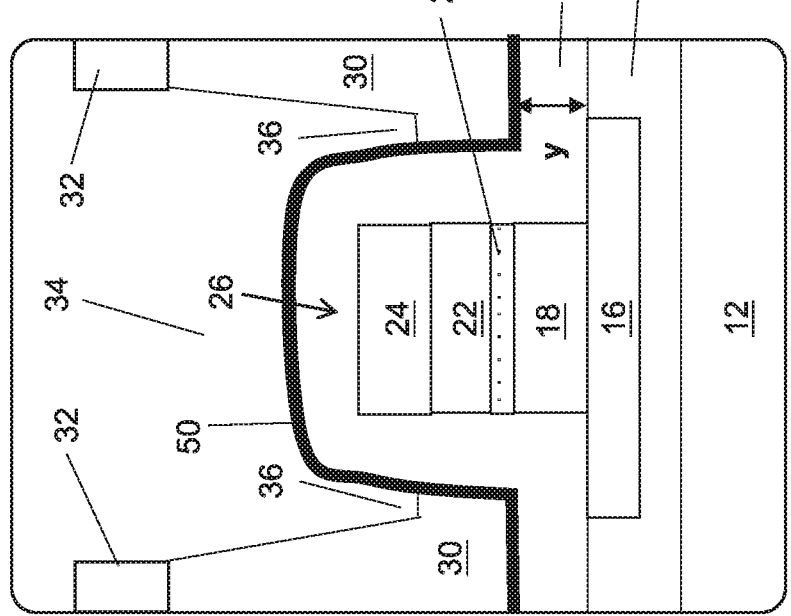
FIG. 5 is a cross-sectional view of another magnetic memory device having an etch stop layer formed on an encapsulation layer in accordance with the present principles.

Referring to FIG. 5, in another embodiment, an etch stop layer 50 is employed on the encapsulation layer 28 to expand etch window. A MRAM pillar device 10' is encapsulated in the encapsulation layer or film 28. The encapsulation layer 28 includes a dielectric layer. In one embodiment, the encapsulation layer 28 includes a nitride film, e.g., SiN. The layer 28 may be deposited by, e.g., physical vapor deposition (PVD), plasma-enhanced chemical vapor deposition (PECVD) or any other suitable process. A height (y) or thickness of the layer 28 above the bottom contact electrode 16 can be controlled by varying deposition time. In one embodiment, y is between about 10 nm and 40 nm. The thickness, y, provides a minimum dielectric separation over the bottom electrode 16. In this embodiment, the etch stop layer increases the dielectric thickness by the thickness of the etch stop layer 50. Alternately, the etch stop layer 50 may be integrated into the total thickness (e.g., y).

The etch stop layer 50 is conformally formed on the encapsulation layer 28 and may include 2-10 nm in thickness. The etch stop layer 50 may include a high etch resistance and may include a nitride, e.g., SiN, SiON, SiBCN, etc.

The stack 26 is then covered with a dielectric material 30. In one embodiment, the encapsulation layer 28 may include a nitride, and the dielectric material 30 may include an oxide, e.g. $SiO_x$. The photoresist 32 is deposited on (e.g., spun on) the dielectric material 30 and patterned using lithography. The photoresist 32 is opened up over the stack 26.

Figure 6:
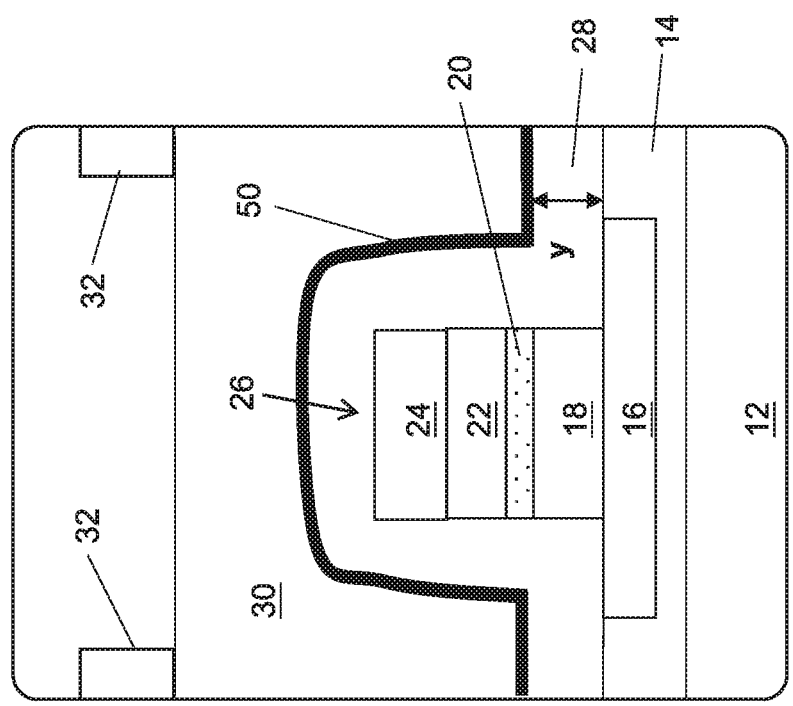
FIG. 6 is a cross-sectional view of the magnetic memory device of FIG. 5 having a recess formed over the device and the etch stop layer being exposed in accordance with the present principles.

Referring to FIG. 6, the dielectric material 30 is etched using a chemistry that will remove the dielectric material 30 and stop on the etch stop layer 50. The etch process may include a RIE process with a fluorine-based plasma etch chemistry or equivalent for opening the dielectric material 30 and exposing the etch stop layer 50.

Figure 7:
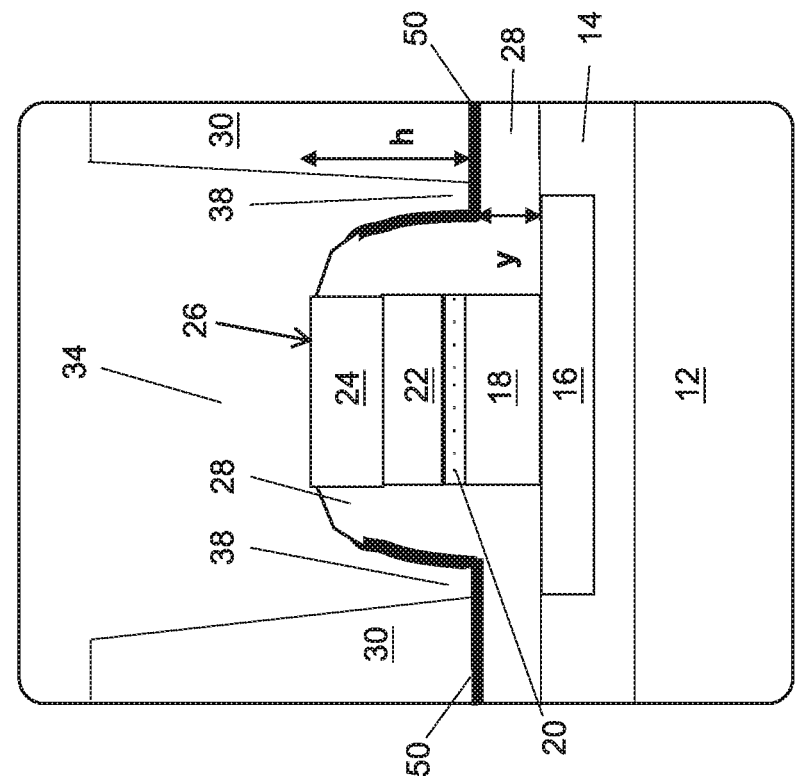
FIG. 7 is a cross-sectional view of the magnetic memory device of FIG. 6 having the etch stop layer and the encapsulating layer etched to expose the hard mask in accordance with the present principles.

Referring to FIG. 7, another etch process is performed to open up the etch stop layer 50 and a portion of the encapsulation layer 28 to expose the hard mask 24. The hard mask 24 may include $SiN_x$ and should have a higher etch resistance than the encapsulation layer 28. In one embodiment, the etch includes another RIE that removes the etch stop layer 50 relative to the encapsulation layer and the dielectric material 30.

By use of a timed or end pointed etch, the etch stop layer 50 and the encapsulation layer 28 are opened to expose the hard mask 24. A level of the dielectric material 30 remains in regions 36 on sides of the pillar 26 over horizontal portions of the encapsulation layer 28. A recess 34 is etched into and aligned to the pillar 26 using the resist 32 as a mask.

Figure 8:
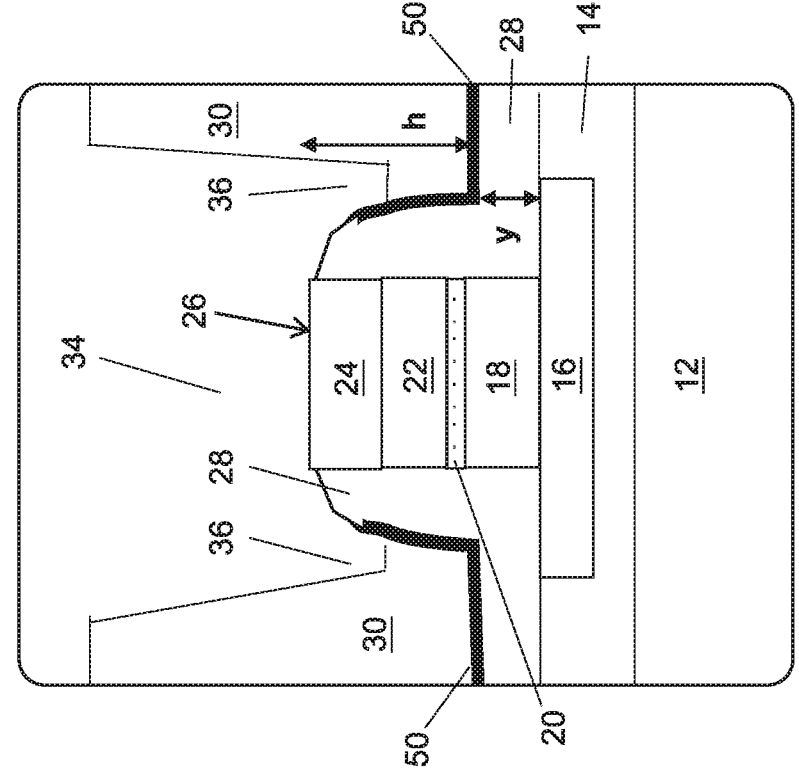
FIG. 8 is a cross-sectional view of the magnetic memory device of FIG. 7 having lateral trenches formed on sides of a magnetic stack in accordance with the present principles.

Referring to FIG. 8, another etch process employs a selective chemistry to etch the dielectric material 30 preferentially to the encapsulation layer 28 and the hard mask 24, e.g., etch oxide preferentially to nitride. This permits a trench contact depth (h) from a top of the hard mask 24 to the etch stop layer 50 and the encapsulation layer 28 to be controlled by the height (y) of the encapsulation layer 28 and/or etch stop layer 50 over the bottom contact electrode 16. The dielectric material 30 is etched to form trenches 38 on top of the encapsulation layer 28 and on lateral sides of the pillar 26.

Figure 9:
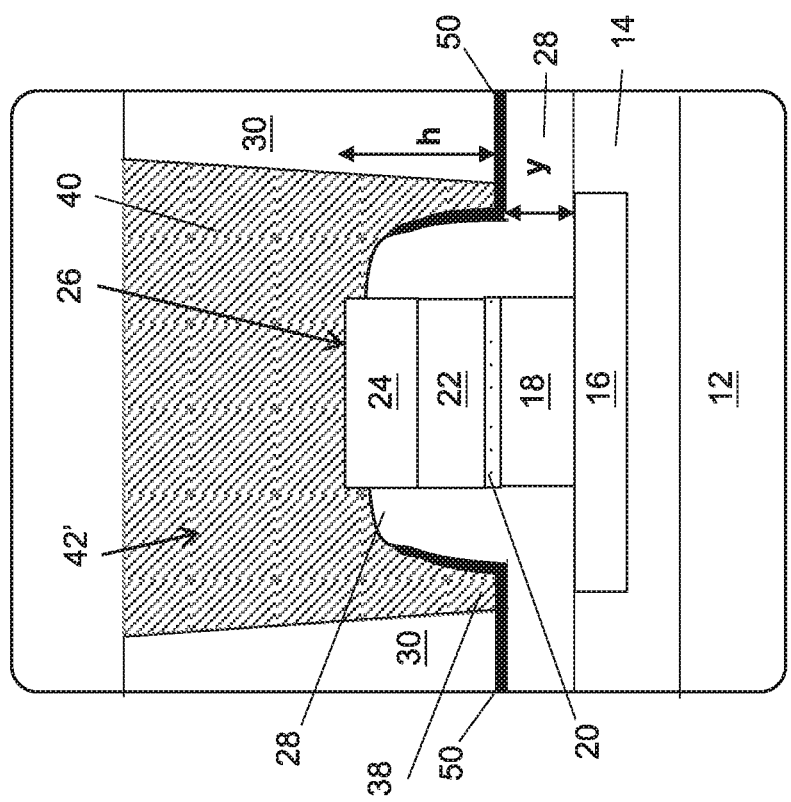
FIG. 9 is a cross-sectional view of the magnetic memory device of FIG. 8 showing a top electrode formed in the lateral trenches on the sides of the magnetic stack in accordance with the present principles.

Referring to FIG. 9, a conductive material 40 is deposited over the dielectric material 30, the hard mask 24 and the etch stop layer 50. The conductive material 40 is planarized to form a top electrode 42'. The top electrode 42' fills the trenches 38 on sides of the stack 26. The conductive material 40 remains gapped by at least the distance y (with the etch stop layer 50) on the encapsulation layer 28. The encapsulation layer 28 ensures that coercively remains high in changing the state of the device 10, and in particular, by ensuring that a minimum amount of dielectric (distance y) exists between the top electrode 42' and the bottom electrode 16.

The top electrode 42' may include a conductive material, such as Cu, Al, Ag, Au, Pt, W, etc. The top electrode 42' is connected to other metallization connections (not shown) to enable a current to flow for reading and writing to the device 10'.

Hc is increased in accordance with the present principles for devices 10 and 10', e.g., STT-MRAM, by controlling a dielectric depth between the top contact 42, 42' and the bottom contact 16. For small device diameters (e.g., less than 50 nm) in many applications, varying the depth of contact by ~20-30 nm results in a marked (>200%) increase in Hc in accordance with the present principles. By way of an illustrative example, a comparison between a shallow depth trench and a deep trench (e.g., 35 nm deeper) resulted in an Hc improvement from less than 1000 Oe for the shallow trench to a greater than 2000 Oe for the deep trench.

Figure 10:
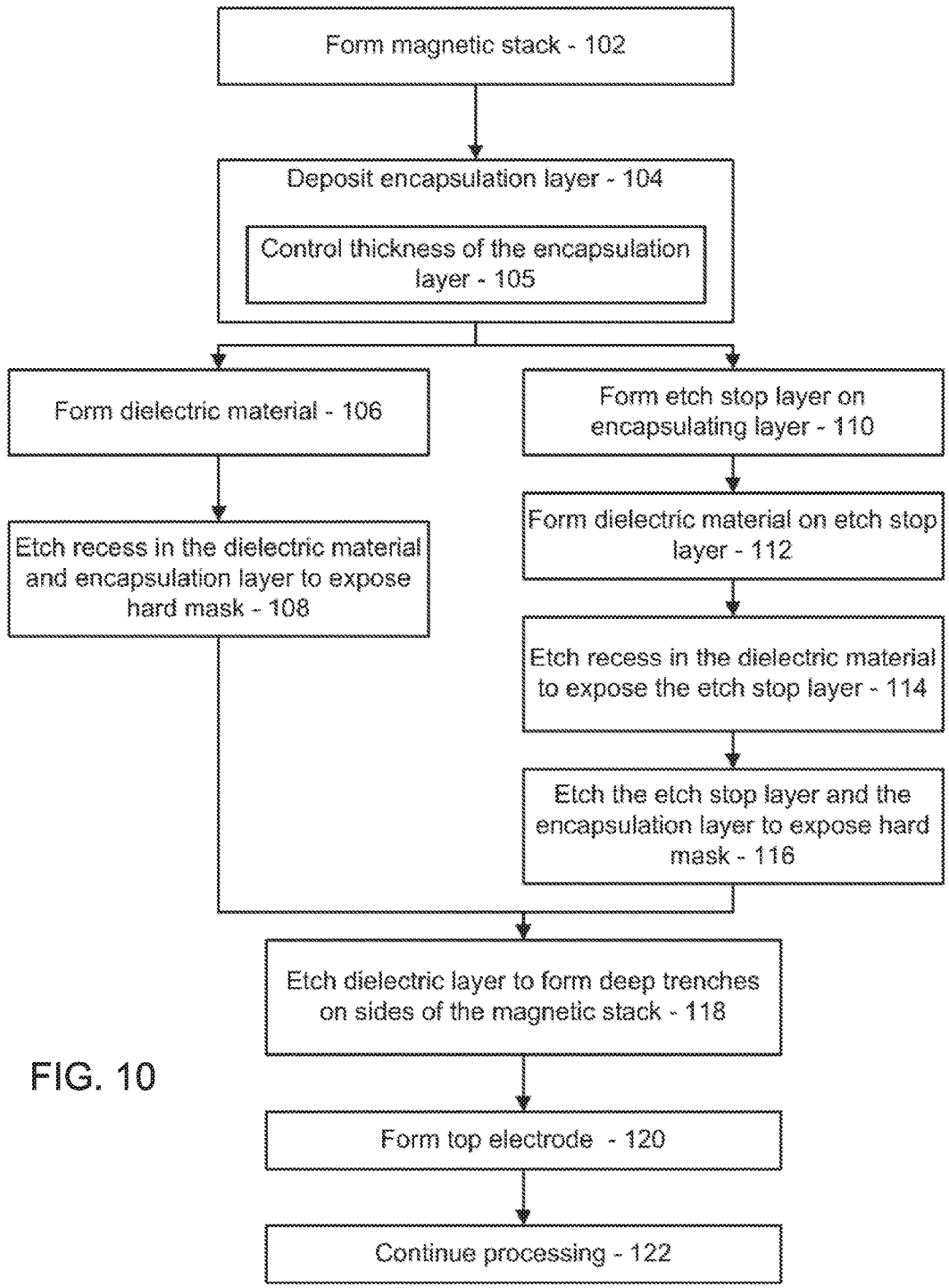
FIG. 10 is a block/flow diagram showing methods for making a magnetic memory device in accordance with illustrative embodiments.

Referring to FIG. 10, methods for fabricating a magnetic memory device are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a magnetic memory stack is formed with a hard mask thereon on a bottom electrode. The magnetic memory stack may include a magnetic reference layer, a non-magnetic barrier layer and a magnetic free layer with a hard mask thereon. In block 104, an encapsulation layer is deposited over a top and sides of the hard mask and the magnetic memory stack. The encapsulation layer includes a thickness adjacent to the sides of magnetic memory stack formed on portions of the bottom electrode. The encapsulation layer may include nitride having a thickness of between about 10 nm and about 40 nm. In block 105, the thickness of the encapsulation layer is controlled to control or adjust coercively (Hc) of the magnetic memory stack.

In one embodiment, a dielectric material is formed over the encapsulation layer in block 106. In block 108, a recess is etched in the dielectric material and into the encapsulation layer to expose the hard mask. The dielectric material may include silicon oxide, and the encapsulation layer may include silicon nitride. The recess is formed by etching the dielectric material and the encapsulating layer selectively to the hard mask.

In another embodiment, an etch stop layer is formed on the encapsulation layer followed by a dielectric material formed over the etch stop layer in block 110. In block 112, a dielectric material is formed over the etch stop layer. In block 114, a recess is etched in the dielectric material to expose the etch stop layer. The recess is etched in the dielectric material selectively to the etch stop layer. In block 116, the etch stop layer and the encapsulation layer are etched selectively to the dielectric material to expose the hard mask. The dielectric material may include silicon oxide, and the etch stop layer and the encapsulation layer may include silicon nitride. The etch stop layer and the encapsulation layer may be etched selectively to the hard mask.

In block 118, the dielectric material is etched to form deep trenches between the dielectric material and the layer (e.g., the encapsulation layer or the etch stop layer) at the sides of the magnetic memory stack. Then, the dielectric material is etched selectively to the hard mask, the encapsulating layer and/or the etch stop layer.

In block 120, a top electrode is formed over the hard mask and in the trenches such that the top electrode is spaced apart from the bottom electrode by at least the thickness. The thickness may include the thickness of the encapsulation layer alone or the thickness of the encapsulation layer and the etch stop layer. In block 122, processing continues as needed to complete the device.

Having described preferred embodiments for enhanced coercivity in MTJ devices by contact depth control (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a magnetic memory device, comprising:
    forming an encapsulation layer having a thickness directly on a major surface of a bottom electrode and adjacent to sides of a magnetic memory stack formed directly on the major surface of the bottom electrode;
    etching a recess through the encapsulation layer to expose a hard mask formed on the memory stack;
    forming trenches between a dielectric material and the encapsulation layer at the sides of the magnetic memory; and
    forming a top electrode over the hard mask and in the trenches such that the top electrode is spaced apart from the bottom electrode by at least the thickness.

2. The method as recited in claim 1, wherein the encapsulation layer includes nitride having a thickness of between about 10 nm and about 40 nm.

3. The method as recited in claim 1, wherein the dielectric material includes silicon oxide and the encapsulation layer includes silicon nitride and etching the recess includes etching the dielectric material and the encapsulating layer selective to the hard mask.

4. The method as recited in claim 1, wherein the dielectric material includes silicon oxide and the encapsulation layer includes silicon nitride and etching the recess includes etching the dielectric material selective to the hard mask and the encapsulating layer.

5. The method as recited in claim 1, wherein forming the encapsulation layer includes controlling the thickness of the encapsulation layer to control coercively (Hc) of the magnetic memory stack.

6. The method as recited in claim 1, wherein the magnetic memory stack includes a magnetic reference layer, a non-magnetic barrier layer and a magnetic free layer.

7. The method as recited in claim 1, wherein the major surface of the bottom electrode extends beyond sidewalls of the magnetic stack.

8. The method as recited in claim 1, wherein forming trenches includes:
    depositing the dielectric material over the encapsulation layer; and
    etching the dielectric layer and the encapsulation layer over the magnetic memory stack.

9. The method as recited in claim 8, wherein etching the dielectric layer and the encapsulation layer includes etching using a timed etch.

10. The method as recited in claim 8, wherein etching the dielectric layer and the encapsulation layer includes etching using an end pointed etch.

11. The method as recited in claim 8, wherein etching the dielectric layer and the encapsulation layer includes etching using a resist etch mask centered on the magnetic memory stack.

12. A method for fabricating a magnetic memory device, comprising:
    controlling a thickness of an encapsulation layer formed directly on a major surface of a bottom electrode and over a magnetic memory stack to control coercively (Hc) of a magnetic memory stack, the thickness being adjacent to sides of the magnetic memory stack, which is formed directly on major surface of the bottom electrode;
    etching a recess through the encapsulation layer to expose a hard mask formed on the memory stack;
    forming trenches between a dielectric material and the encapsulation layer at the sides of the magnetic memory stack; and
    forming a top electrode over the hard mask and in the trenches such that the top electrode is spaced apart from the bottom electrode by at least the thickness.

13. The method as recited in claim 12, wherein the encapsulation layer includes nitride having a thickness of between about 10 nm and about 40 nm.

14. The method as recited in claim 12, wherein the dielectric material includes silicon oxide and the encapsulation layer includes silicon nitride and etching the recess includes etching the dielectric material and the encapsulating layer selective to the hard mask.

15. The method as recited in claim 12, wherein the dielectric material includes silicon oxide and the encapsulation layer includes silicon nitride and etching the recess includes etching the dielectric material selective to the hard mask and the encapsulating layer.

16. The method as recited in claim 12, wherein the magnetic memory stack includes a magnetic reference layer, a non-magnetic barrier layer and a magnetic free layer.

17. The method as recited in claim 12, wherein the major surface of the bottom electrode extends beyond sidewalls of the magnetic stack.

18. The method as recited in claim 12, wherein forming trenches includes:
    depositing the dielectric material over the encapsulation layer; and
    etching the dielectric layer and the encapsulation layer over the magnetic memory stack.

19. The method as recited in claim 18, wherein etching the dielectric layer and the encapsulation layer includes etching using a timed etch.

20. The method as recited in claim 18, wherein etching the dielectric layer and the encapsulation layer includes etching using a resist etch mask centered on the magnetic memory stack.

* * * * *